LOW OUTPUT IMPEDANCE SEMICONDUCTOR AMPLIFIER

Filed Oct. 30, 1956

INVENTOR,
Douglas J. Hamilton,
BY
ATTORNEY 2,868,897

LOW OUTPUT IMPEDANCE SEMICONDUCTOR AMPLIFIER

Douglas J. Hamilton, Santa Monica, Calif., assignor to Hughes Aircraft Company, Culver City, Calif., a corporation of Delaware Application October 30, 1956, Serial No. 619,918

7 Claims. (Cl. 179—171)

Figure 1:
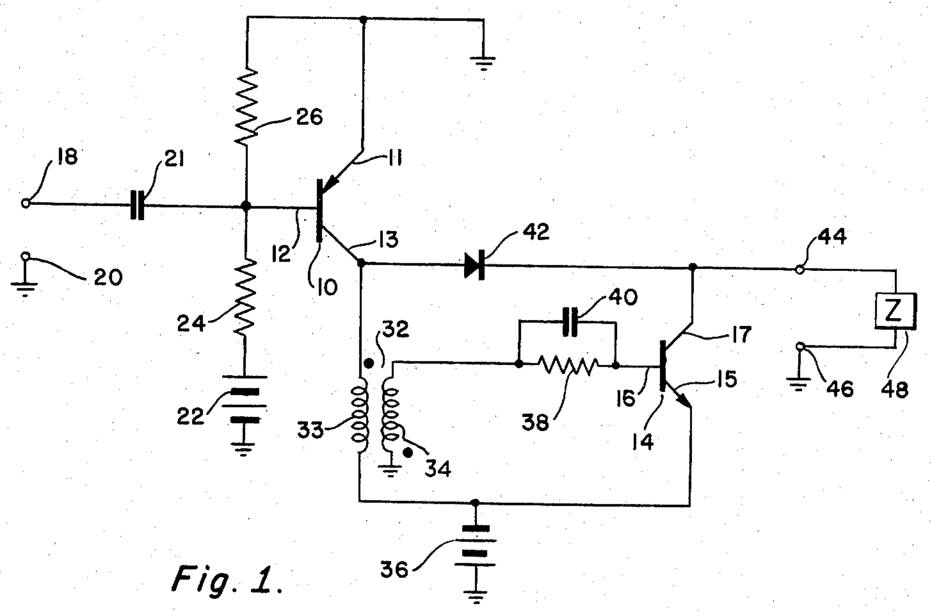

The present invention relates to pulse amplifiers and more particularly to a transistor pulse amplifier having low output impedance characteristics.

In many electronic systems it is desirable and necessary to utilize pulse amplifiers which will permit changes in current flow through the load circuit connected across the output terminals thereof while causing negligible changes in the voltage across the output terminals. In digital computers, amplifiers having these characteristics are utilized for amplifying the master timing signal or clock pulse. Generally, pulse amplifiers have been used for this purpose which present a low output impedance or a low impedance looking into the output terminals of the amplifier during the time when the pulse generator is turned "on" or during the clock pulse interval but present a high output impedance when the pulse generator is turned "off" or between successive clock pulses. The output impedance during the clock pulse interval is determined primarily by the nature of the pulse forming device, e. g., whether the amplifier utilizes a tube or transistor as its active element; and the output impedance between clock pulses is usually determined by passive circuit elements in the output circuits of the amplifiers.

To obtain the necessary low output impedance during the time the pulse generator is turned "off" a diode current sink has been utilized in the output circuit of the amplifier. With such a current sink connected across the output terminals of the amplifier, the output impedance of the amplifier is low where the change of current flow through the load connected across the output terminals of the amplifier is small compared with the total current flow through the diode. There are several disadvantages inherent in the use of such a diode. First, the pulse generator must provide the sink current as well as the load current during the pulse time. Second, the sink current through the diode must be supplied by some external source when the pulse generator is in its "off" state. Hence, considerable power is required even during the time that the clock pulse or input signal is not present.

It is an object of the present invention to provide a pulse amplifier which has a low output impedance whether an input signal is present or not.

It is a further object of the present invention to provide a pulse amplifier having a low output impedance which requires a minimum amount of power.

In accordance with the present invention, a pulse amplifier is provided in which a first signal translating device is adapted to amplify an input signal and impress the amplified signal across a pair of output terminals. A second signal translating device is connected across the output terminals and is coupled to the first device for providing a low output impedance across the output terminals when the first device is in a nonconducting state.

Figure 2:
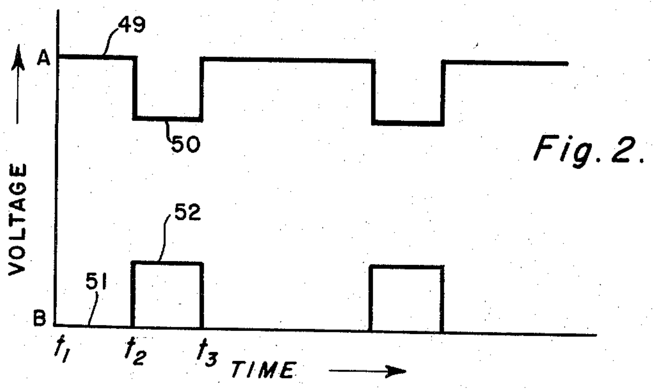

The novel features which are believed to be characteristic of the invention both as to its organization and method of operation, together with further objects and advantages thereof will be better understood from the following description considered in connection with the accompanying drawing in which:

Fig. 1 is a schematic circuit diagram of a transistor pulse amplifier embodying the principles of the present invention for providing a low output impedance; and Fig. 2 is a graph illustrating two waveforms taken at separate points in the circuit of Fig. 1.

Referring now to the drawing and particularly to Fig. 1, there is shown a pulse amplifier which includes two transistors 10 and 14. Transistor 10 is illustrated as a junction transistor of the PNP type, and transistor 14 is illustrated as a junction transistor of the NPN type. Accordingly, transistors 10 and 14 are of the opposite conductivity type, i. e., one is an NPN and the other is a PNP transistor. It is to be understood that other types of transistors may be utilized as the active elements of the pulse amplifier with appropriate changes of the bias voltage to insure their proper operation. The transistor 10 includes an emitter electrode 11, a base electrode 12 and a collector electrode 13, and transistor 14 is provided with an emitter electrode 15, a base electrode 16 and a collector electrode 17.

The transistor 10 is connected in a common emitter configuration with its input or base-emitter circuit connected across a pair of input terminals 18 and 20. As is shown, the emitter electrode 11 and the terminal 20 are connected to ground, and the base electrode 12 is connected in series with a coupling capacitor 21 to the input terminal 18.

The transistor 10 is rendered nonconducting in the absence of an input signal by means of the base bias provided by a battery 22 and a pair of voltage divider resistors 24 and 26. The junction point of the resistors 24 and 26 is connected to the base 12 and the resistor 26 is grounded. The positive terminal of the battery 22 is connected to the resistor 24 to supply a positive bias to the base 12. The collector 13 is biased by means of battery 36 to render the transistor 10 conducting when an appropriate signal is applied to its input or base-emitter circuit. The output or emitter-collector circuit of transistor 10 is coupled to the input or base-emitter circuit of the transistor 14 by means of a signal inverting transformer 32 to control the state of conduction of the transistor 14 inversely with the current flow through the transistor 10. The primary winding 33 and the secondary winding 34 of the transformer 32 are wound as indicated by the dots to provide a signal inversion between the primary and secondary windings. The primary winding 33 is connected between the collector 13 and the negative terminal of the battery 36, and the secondary winding 34 is connected between ground and one terminal of a coupling network consisting of a resistor 38 and a capacitor 40 connected in parallel. The other terminal of the coupling network is connected to the base 16.

The transistor 14 is also connected in a grounded emitter configuration with its emitter connected directly to the negative terminal of the battery 36 to provide the proper bias potential for the base-emitter circuit of the transistor 14 to render it conducting in the absence of a negative signal applied to its base 16. The output circuit of the transistor 10 is connected to the output of emitter-collector circuit of transistor 14 by means of a gating element or rectifier 42 connected between the collectors 13 and 17 with its anode connected to the collector 13. The rectifier 42 may be a semiconductor diode as shown by its conventional symbol and serves the purpose of isolating the first transistor 10 from the output circuit of the second transistor when the first transistor is in a nonconducting state. A pair of output terminals 44 and 46 is connected to the output circuit or the collector electrode 17 of the transistor 14 and to signal ground respectively for impressing the output signal from the amplifier across a load schematically indicated at 48.

In discussing the operation of the circuit of Fig. 1, reference is now made to Fig. 2 wherein the abscissa represents time and the ordinate represents voltage. Curve A was taken by measuring the voltage across the input terminals 18 and 20 and curve B was taken by measuring the voltage across the output terminals 44 and 46. During the time interval from $t_1$ to $t_2$ the input signal is at its low level as indicated by the line 49, and the base-emitter circuit of the transistor 10 is biased in the reverse direction as a result of the positive voltage impressed on the base 12 by the battery 22 and the voltage divider resistors 24 and 26. Hence, the transistor 10 is in its nonconducting state.

During this time the base-emitter circuit of the transistor 14 is biased in the forward direction by means of the negative voltage impressed by the battery 36 on the emitter 15 which renders the transistor 14 conducting. Hence, during the time interval from $t_1$ to $t_2$ current is flowing from the load 48 connected across the output terminals 44 and 46 through the collector-emitter circuit of the transistor 14. The impedance across the collector-emitter circuit of the transistor 14 is low of the order of several ohms and hence this current path represents a low output impedance for the pulse amplifier in the absence of an input signal. Because of this low output impedance, any changes in the current that flows through the load 48 will result in a negligible change in the voltage across the output terminals 44 and 46. Since the transistor 10 is nonconducting, no current is flowing in the primary winding 33 and the anode of the diode 42 is maintained at the negative voltage of the battery 36. The transistor 14 is conducting and the voltage divider network consisting of the load 48 and the collector-emitter circuit of the transistor 14 maintains the cathode of the diode 42 at some potential between ground and the negative voltage of the battery 36 or at a positive potential with respect to the anode of the diode. Hence, the diode 42 is biased in the reverse direction and isolates the output or emitter-collector circuit of the transistor 10 from the emitter-collector circuit of the transistor 14.

At time $t_2$ a negative signal 50, as indicated in Fig. 2, is applied across the input terminals 18 and 20 and biases the base-emitter circuit of the transistor 10 in a forward direction to render it conducting. The pulse or signal current flowing through the emitter-collector circuit of the transistor 10 traverses the primary winding 33 of the transformer 32 and induces a negative pulse or voltage across the secondary winding 34. This negative signal is applied to the base 16 and biases the base-emitter circuit of the transistor 14 in the reverse direction and thereby renders the transistor 14 nonconducting. The pulse current flowing through the transistor 10 raises the anode potential of the diode 42 towards the high level 52. Since the cathode potential of the diode is at the low level 51, the diode is biased in the forward direction and passes the pulse current flowing through the transistor 10 through the load 48. Since the transistor 14 is nonconducting, no pulse current flows into the collector of the transistor 14.

There has thus been provided a pulse amplifier in which a first semiconductor signal translating device is adapted to amplify the input signal, and a second semiconductor signal translating device is connected across the output circuit of the first signal translating device to control the current flow through the second signal translating device inversely with the current flow through the first signal translating device. Accordingly, a low impedance is provided across the output circuit of the first signal translating device when the first signal translating device is in a nonconducting state.

What is claimed is:

1. A pulse amplifier comprising a first semiconductor signal translating device including a first input and a first output circuit, a second semiconductor signal translating device including a second input and a second output circuit, signal input means connected to said first input circuit, circuit means connected between said first output circuit and said second input circuit for controlling the current flow through said second device inversely with the current flow through said first device, said second output circuit providing a low impedance when said first device is in a nonconducting state, and means providing a direct current conductive path connected between said first output circuit and said second output circuit for impressing an output signal from said first device across said second output circuit.

2. A pulse amplifier comprising a first transistor including a first input and a first output circuit, a second transistor including a second input and a second output circuit, signal input means connected to said first input circuit, circuit means connected between said first output circuit and said second input circuit for controlling the current flow through said second transistor inversely with the current flow through said first transistor, output terminals coupled to said second output circuit, said second output circuit presenting a low impedance across said terminals when said first device is in a nonconducting state, a gating element connected between said first output circuit and said terminals for impressing an output signal from said first transistor across said output terminals and for isolating said first output circuit from said second output circuit when said first transistor is in a nonconducting state.

3. A pulse amplifier comprising a first transistor including a first input and a first output circuit, a second transistor including a second input and a second output circuit, signal input means connected to said first input circuit, means coupled to said first input circuit for rendering said first transistor nonconducting in the absence of a signal impressed across said input circuit, circuit means connected between said first output circuit and said second input circuit for controlling the current flow through said second transistor inversely with the current flow through said first transistor, means connected to said second input circuit for rendering said second transistor conducting in response to the nonconduction of said first transistor, gating means connected between said first and second output circuits for impressing an output signal from said first transistor across said second output circuit and for isolating said first output circuit from said second output circuit when said first transistor is nonconducting, and means connected to said second output circuit for deriving an output signal therefrom.

4. A pulse amplifier having a low output impedance comprising a first transistor including a first emitter, a first collector and a first base in contact therewith, a second transistor including a second emitter, a second collector and a second base in contact therewith, one of said transistors being of the PNP type and the other one of said transistors being of the NPN type, signal input means connected between said first emitter and said first base for impressing an input signal therebetween, circuit means including a transformer connected between said first collector and said second base for controlling the current flow through said second transistor inversely with the current flow through said first transistor, output signal means coupled to said second collector, a gating element connected between said collectors for providing a low impedance to current flow through said first transistor and for providing a high impedance for current flow through said second transistor to isolate said first transistor from said second transistor when said first transistor is in a nonconducting state.

5. A pulse amplifier comprising a first transistor of one conductivity type including a first emitter, a first collector and a first base in contact therewith, a second transistor of the other conductivity type including a second emitter, a second collector and a second base in contact therewith, signal input means connected between said first emitter and said first base for impressing an input signal therebetween, means including a voltage source coupled to said first emitter and said first base for rendering said first transistor nonconducting in the absence of said input signal, signal inverting means connected between said first collector and said second base for controlling the current flow through said second transistor inversely with the current flow through said first transistor, gating means connected between said collectors for impressing an output signal from said first transistor between said second collector and a point of fixed reference potential and for providing signal translation between said first collector and said second base when said first transistor is in a conducting state, and means connected to said second collector for deriving said output signal, said second transistor providing a low impedance between said second collector and said point of fixed reference potential when said first transistor is in a nonconducting state.

6. A pulse amplifier comprising a first junction transistor of one conductivity type including a first emitter, a first collector and a first base in contact therewith, a second junction transistor of the opposite conductivity type including a second emitter, a second collector and a second base in contact therewith, a pair of input terminals coupled to said first base and to said first emitter, bias means coupled to said first base for rendering said first transistor nonconducting in the absence of an input signal, a transformer coupled between said first collector and said second base for applying a signal to said second base that is inversely proportional with the amplitude of the current flowing in said first collector, bias means coupled to said second emitter for rendering said second transistor conducting in the absence of a signal applied between its base and emitter, a pair of output terminals coupled to said second collector, said second transistor providing a low impedance across said output terminals when said first transistor is in a nonconducting state, and a unidirectionally conducting element connected between said collectors for impressing an output signal from said first transistor across said output terminals.

7. A pulse amplifier comprising a first junction transistor including a first emitter, a first collector and a first base in contact therewith, a second junction transistor including a second emitter, a second collector and a second base in contact therewith, one of said transistors being of the PNP type and the other one of said transistors being of the NPN type, signal input means coupled between said first base and said first emitter, a first source of direct current energizing potential, a pair of voltage divider resistors having a common junction point connected in series between said source of bias potential and said first emitter, said first base being directly connected to said common junction point, said source of potential being poled in such a direction to apply a reverse bias between said first base and said first emitter, a transformer having a primary and a secondary winding, said windings being wound in such a direction to induce a signal across said secondary winding that is of opposite polarity with respect to the signal impressed across said primary winding, said primary winding and a second source of direct current energizing potential connected in the order named between said first collector and said first emitter, said second emitter being directly connected to the junction of said primary winding and said second source of potential, a direct current conductive impedance element and said secondary winding connected in series between said second base and a point of fixed reference potential, a diode connected in series between said collectors and a pair of output terminals coupled between said second collector and said second emitter.

References Cited in the file of this patent

UNITED STATES PATENTS 2,791,644 Sziklai ________________ May 7, 1957

Notice of Adverse Decision in Interference

In Interference No. 90,251 involving Patent No. 2,868,897, D. J. Hamilton, LOW OUTPUT IMPEDANCE SEMICONDUCTOR AMPLIFIER, final judgment adverse to the patentee was rendered May 10, 1961, as to claims 1, 2 and 3.

[*Official Gazette May 4, 1965.*]